United States Patent
Zhang et al.

(10) Patent No.: US 8,580,659 B2
(45) Date of Patent: Nov. 12, 2013

(54) METHOD OF FABRICATING HIGH-MOBILITY DUAL CHANNEL MATERIAL BASED ON SOI SUBSTRATE

(75) Inventors: Miao Zhang, Shanghai (CN); Bo Zhang, Shanghai (CN); Zhongying Xue, Shanghai (CN); Xi Wang, Shanghai (CN)

(73) Assignee: Shanghai Institute of Microsystem and Information Technology, Chinese Academy of Sciences, Changning District Shanghai (CN)

( * ) Notice: Subject to any disclaimer, the term of this patent is extended or adjusted under 35 U.S.C. 154(b) by 9 days.

(21) Appl. No.: 13/262,656

(22) PCT Filed: Jul. 25, 2011

(86) PCT No.: PCT/CN2011/077580
§ 371 (c)(1),
(2), (4) Date: Oct. 3, 2011

(87) PCT Pub. No.: WO2012/167487
PCT Pub. Date: Dec. 13, 2012

(65) Prior Publication Data
US 2013/0029478 A1 Jan. 31, 2013

(30) Foreign Application Priority Data
Jun. 8, 2011 (CN) .......................... 2011 1 0151806

(51) Int. Cl.
*H01L 21/20* (2006.01)
(52) U.S. Cl.
USPC .................................... 438/479; 257/E21.09
(58) Field of Classification Search
None
See application file for complete search history.

(56) References Cited

U.S. PATENT DOCUMENTS

| | | | | |
|---|---|---|---|---|
| 7,436,046 B2 * | 10/2008 | Kondo et al. | ................. | 257/616 |
| 8,097,529 B2 * | 1/2012 | Krull et al. | ..................... | 438/515 |
| 8,216,951 B2 * | 7/2012 | Cheng et al. | .................. | 438/979 |
| 8,227,792 B2 * | 7/2012 | Agnello et al. | ................. | 257/19 |
| 2003/0127646 A1 * | 7/2003 | Christiansen et al. | .......... | 257/55 |
| 2005/0179028 A1 | 8/2005 | Chen et al. | | |
| 2005/0221591 A1 | 10/2005 | Bedell et al. | | |

FOREIGN PATENT DOCUMENTS

CN 101740463 A 6/2010

OTHER PUBLICATIONS

International Search Report in corresponding PCT Application No. PCT/CN2011/077580 issued on Jan. 5, 2012.

* cited by examiner

*Primary Examiner* — Zandra Smith
*Assistant Examiner* — Damian A Hillman
(74) *Attorney, Agent, or Firm* — Global IP Services; Tianhua Gu

(57) ABSTRACT

The present invention discloses a method of fabricating high-mobility dual channel material based on SOI substrate, wherein compressive strained SiGe is epitaxially grown on a conventional SOI substrate to be used as channel material of PMOSFET; Si is then epitaixally grown on SiGe, and approaches such as ion implantation and annealing are employed to allow relaxation of part of strained SiGe and transfer strain to the Si layer thereon so as to form strained Si material as channel material of NMOSFET. With simple process and easy realization, this method can provide high-mobility channel material for NMOSFET and PMOSFET at the same time, well meeting the requirement of simultaneously enhancing the performance of NMOSFET and PMOSFET devices and therefore providing potential channel material for CMOS process of the next generation.

10 Claims, 3 Drawing Sheets

METHOD OF FABRICATING HIGH-MOBILITY DUAL CHANNEL MATERIAL BASED ON SOI SUBSTRATE

FIELD OF THE INVENTION

The present invention relates to a method of fabricating dual channel material for complementary metal-oxide semiconductor (CMOS) devices, and more particularly to a method of fabricating high-mobility dual channel material based on silicon-on-insulator (SOI) substrate, belonging to the field of microelectronics and solid electronics.

BACKGROUND OF THE INVENTION

With the development of integrated circuits technology, device feature size is becoming smaller and low electron and hole mobility in bulk silicon (Si) material has become the bottleneck of enhancing device performance. Strained silicon is formed by epitaxially growing silicon on materials that have different lattice constant from silicon, or by stretch or compressive deformation of silicon lattice structure through other processes. Because strained silicon can effectively improve carrier mobility, it has become a candidate substrate material for semiconductor technology node of the next generation. Since SiGe substrate has different lattice constant from Si, there would be lattice mismatch between SiGe substrate and epitaxial Si grown thereon and such lattice mismatch will therefore induce strain in epitaxial Si layer. Due to lattice structure distortion, strained silicon material can simultaneously enhance electron and hole mobility, and strained silicon on insulator (sSOI) features strong points of both silicon on insulator (SOI) and strained silicon, enjoying extensive application prospect in integrated circuits technology.

Strained silicon on insulator can also be a combination of strained Si and (strained) SiGe, that is to say, a dual channel layer structure formed by strained Si/ (strained) SiGe (where Si is the surface layer and SiGe is the buried layer). In unique energy band structure of dual channel, electrons are restricted within strained Si layer and can get high electron mobility, while holes are restricted within (strained) SiGe layer and can get high hole mobility.

Therefore, the present invention provides a process of fabricating strained Si/SiGe dual channel material based on SOI substrate, which can be used to simultaneously provide high-mobility channel material for NMOS and PMOS.

SUMMARY OF THE INVENTION

The technical problem to be solved in the present invention is to provide a method of fabricating high-mobility dual channel material based on SOI substrate.

In order to solve the foregoing technical problem, the present invention adopts the following technical scheme:

A method of fabricating high-mobility dual channel material based on SOI substrate, comprising the following steps:

Step 1, form an epitaxial SiGe layer on a SOI substrate, wherein said SOI substrate is composed of a silicon substrate, an insulating buried layer and a silicon top layer from down to up;

Step 2, form a Si cap layer on said SiGe layer;

Step 3, form a photoresist layer on said Si cap layer and expose part of Si cap layer by lithography and etch;

Step 4, continue epitaxial growth of a Si layer on exposed Si cap layer;

Step 5, perform ion implantation to distribute implanted ions within the silicon top layer of SOI substrate;

Step 6, perform annealing process to relax the stress in part of SiGe layer and thus transfer stress to the epitaxial Si material thereon to form strained silicon; the formed strained silicon is used to form N-channel metal-oxide-semiconductor field-effect transistor (NMOSFET) channel and the region of SiGe layer covered by photoresist is used to form P-channel metal-oxide-semiconductor field-effect transistor (PMOSFET) channel.

As a preferable scheme of the present invention, the SOI substrate used in step 1 has a silicon top layer with a thickness of 5 nm to 100 nm and an insulating buried layer with a thickness of 10 nm to 500 nm.

As a preferable scheme of the present invention, RCA (Radio Corporation of America) cleaning is necessary for said SOI substrate before epitaxial growth of SiGe layer on SOI substrate in step 1.

As a preferable scheme of the present invention, the Ge content in epitaxial SiGe layer formed in step 1 is in the range of 10% to 50%.

As a preferable scheme of the present invention, the epitaxial SiGe layer formed in step 1 has a thickness of 5 nm to 200 nm.

As a preferable scheme of the present invention, the epitaxial Si cap layer formed in step 2 has a thickness of 2 nm to 5 nm.

As a preferable scheme of the present invention, the epitaxial Si layer formed in step 4 has a thickness of 5 nm to 20 nm.

As a preferable scheme of the present invention, the implanted ion is one or more of hydrogen (H), helium (He), nitrogen (N), silicon (Si) and carbon (C).

As a preferable scheme of the present invention, the ion implantation dose is $1E13$-$1E18/cm^2$ in step 5.

As a preferable scheme of the present invention, the annealing temperature is in the range of 300° C. to 1000° C. and the duration is 1 minute to 2 hours in step 5.

The advantageous effect of the present invention is that:

The present invention employs conventional SOI substrate and form strained Si/SiGe dual channel material on SOI substrate by approaches such as epitaxy, ion implantation and annealing. With simple process and easy realization, this invention can provide high-mobility channel material for NMOSFET and PMOSFET at the same time, well meeting the requirement of simultaneously enhancing the performance of NMOSFET and PMOSFET devices and therefore providing potential channel material for CMOS process of the next generation.

DETAILED DESCRIPTION OF THE EMBODIMENTS

Specific implementation steps of the present invention are further detailed below with reference to the accompanying drawings, which are not drawn to scale for convenience of illustration.

Embodiment 1

Figure 1:
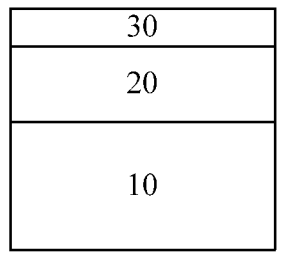
FIGS. 1-8 are schematic process flowcharts of the present invention.
Figure 2:
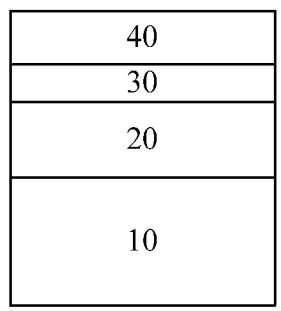

Please refer to FIG. 1-8. This embodiment provides a fabrication method, comprising the following steps:

Step 1, provide a conventional SOI substrate, as shown in FIG. 1, which is composed of a silicon substrate 10, an insulating buried layer 20 and a silicon top layer 30 from down to up, wherein silicon top layer 30 has a thickness of 5 nm to 100 nm and insulating buried layer 20 has a thickness of 10 nm to 500 nm; then perform standard RCA (Radio Corporation of America) cleaning on said SOI substrate to remove surface contaminants; next epitaxially grow SiGe layer 40 on said SOI substrate, as shown in FIG. 2, with a preferable Ge content in SiGe layer 40 in the range of 10% to 50% and a preferable thickness of 5 nm to 200 nm. In order to ensure that the formed SiGe layer 40 has compressive stress, the thickness of SiGe material shall be controlled less than a critical thickness, and in this embodiment, where the Ge content in epitaxial SiGe layer 40 is 20%, the thickness is controlled at about 100 nm.

Figure 3:
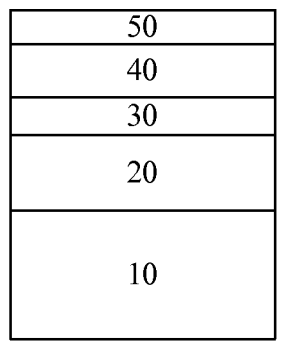

Step 2, as shown in FIG. 3, epitaxially grow Si material on said SiGe layer 40 to form Si cap layer 50. The Si cap layer 50 has a thickness of 2 nm to 5 nm and is used for contact with gate dielectrics with high dielectric constant (H-K) in subsequent fabrication of metal-oxide semiconductor (MOS) devices so as to avoid the formation of interface defect state.

Figure 4:
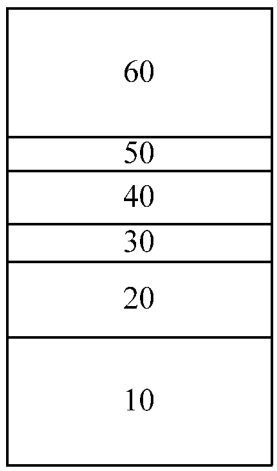
Figure 5:
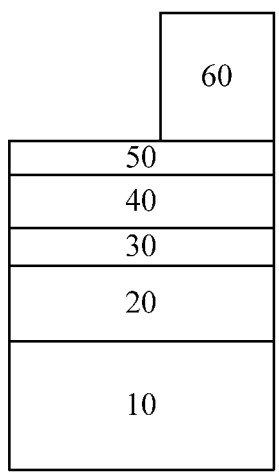

Step 3, form a photoresist layer 60 on said Si cap layer 50 in accordance with the requirement of CMOS process, as shown in FIG. 4; then form corresponding pattern by lithography and etch to expose part of Si cap layer 50, as shown in FIG. 5. As a result, the region designed as PMOSFET can be protected by photoresist, while the region designed as NMOSFET can be exposed for the formation of strained silicon in subsequent process.

Figure 6:
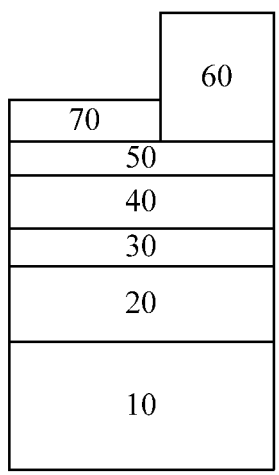

Step 4, as shown in FIG. 6, continue epitaxial growth of a Si layer 70 on exposed Si cap layer 50. Epitaxial Si layer 70 has a preferable thickness of 5 nm to 20 nm so as to completely transfer stress into Si after subsequent stress release of SiGe and thus form strained silicon. In this embodiment, epitaxial Si layer 70 has a thickness of 10 nm.

Figure 7:
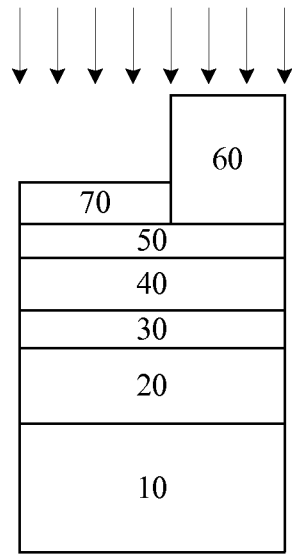

Step 5, as shown in FIG. 7, perform ion implantation to distribute implanted ions within the silicon top layer 30 of SOI substrate. The implanted ion is preferably one or more of H, He, N, Si and C, the preferable implantation dose is $1E13$-$1E18/cm^2$, and the implantation energy is determined by ion species and the thickness of SiGe and Si thereon to make sure the range distribution of ion implantation is within silicon top layer 30 of SOI substrate. In this embodiment, H is used for ion implantation with an implantation dose of $1E15/cm^2$.

Figure 8:
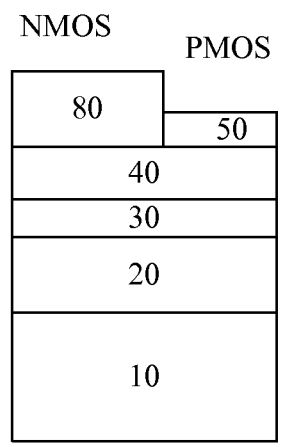

Step 6, perform annealing process with a preferable annealing temperature in the range of 300° C. to 1000° C. and a duration of 1 minute to 2 hours. The damage caused by ion implantation allows stress relaxation in part of SiGe layer 40 and therefore transfer stress to epitaxial Si material thereon to form strained silicon 80. In this embodiment, the annealing temperature is of 600° C. and the duration is of 50 minutes. As shown in FIG. 8, the formed strained silicon 80 is used to form NMOSFET channel and the region of SiGe layer 40 covered by photoresist 60 is used to form PMOSFET channel.

After the removal of photoresist, said dual channel material can be used for the design of PMOSFET on strained SiGe material and the design of NMOSFET on strained Si so as to achieve CMOS process integration.

Embodiment 2

Process steps similar to that of embodiment 1 are employed with the following differences:

The epitaxial SiGe layer formed in step 1 has a Ge content of 10% and a thickness of 200 nm; the epitaxial Si layer formed in step 4 has a thickness of 5 nm; He ion is used for ion implantation with an implantation dose of $1E13/cm^2$ in step 5; an annealing temperature is 1000° C. for a duration of 1 minute in step 6.

Embodiment 3

Process steps similar to that of embodiment 1 are employed with the following differences:

The epitaxial SiGe layer formed in step 1 has a Ge content of 30% and a thickness of 80 nm; the epitaxial Si layer formed in step 4 has a thickness of 10 nm; N ion is used for ion implantation with an implantation dose of $1E15/cm^2$ in step 5; an annealing temperature is 800° C. for a duration of 5 minutes in step 6.

Embodiment 4

Process steps similar to that of embodiment 1 are employed with the following differences:

The epitaxial SiGe layer formed in step 1 has a Ge content of 40% and a thickness of 50 nm; the epitaxial Si layer formed in step 4 has a thickness of 15 nm; Si ion is used for ion implantation with an implantation dose of $1E16/cm^2$ in step 5; an annealing temperature is 400° C. for a duration of 90 minutes in step 6.

Embodiment 5

Process steps similar to that of embodiment 1 are employed with the following differences:

The epitaxial SiGe layer formed in step 1 has a Ge content of 50% and a thickness of 5 nm; the epitaxial Si layer formed in step 4 has a thickness of 20 nm; C ion is used for ion implantation with an implantation dose of $1E18/cm^2$ in step 5; an annealing temperature is 300° C. for a duration of 120 minutes in step 6.

The description of foregoing embodiments is only an illustrative description of the principle and function of the present invention but is not a limitation of the present invention. It is apparent to those skilled in the art that modifications can be made to the foregoing embodiments without deviating from the spirit and scope of the present invention. Accordingly, the protection scope of the present invention shall be as described in the claims.

What is claimed is:

1. A method of fabricating high-mobility dual channel material based on SOI substrate, comprising the following steps:
    Step 1, form an epitaxial SiGe layer having compressive stress on a SOI substrate, wherein said SOI substrate is composed of a silicon substrate, an insulating buried layer and a silicon top layer from down to up;
    Step 2, form a Si cap layer on said SiGe layer;
    Step 3, form a photoresist layer on said Si cap layer and expose part of Si cap layer by lithography and etch;
    Step 4, continue epitaxial growth of a Si layer on exposed Si cap layer;
    Step 5, perform ion implantation to distribute implanted ions within the silicon top layer of SOI substrate;
    Step 6, perform annealing process to relax the stress in part of SiGe layer and thus transfer stress to the epitaxial Si material thereon to form strained silicon; the formed strained silicon is used to form NMOSFET channel and the region of SiGe layer covered by photoresist is used to form PMOSFET channel.

2. The method of fabricating high-mobility dual channel material based on SOI substrate according to claim 1, wherein SOI substrate used in step 1 has a silicon top layer with a thickness of 5 nm to 100 nm and an insulating buried layer with a thickness of 10 nm to 500 nm.

3. The method of fabricating high-mobility dual channel material based on SOI substrate according to claim 1, wherein RCA cleaning is necessary for said SOI substrate before epitaxial growth of SiGe layer on SOI substrate in step 1.

4. The method of fabricating high-mobility dual channel material based on SOI substrate according to claim 1, wherein the Ge content in epitaxial SiGe layer formed in step 1 is in the range of 10% to 50%.

5. The method of fabricating high-mobility dual channel material based on SOI substrate according to claim 1, wherein the epitaxial SiGe layer formed in step 1 has a thickness of 5 nm to 200 nm.

6. The method of fabricating high-mobility dual channel material based on SOI substrate according to claim 1, wherein the epitaxial Si cap layer formed in step 2 has a thickness of 2 nm to 5 nm.

7. The method of fabricating high-mobility dual channel material based on SOI substrate according to claim 1, wherein the epitaxial Si layer formed in step 4 has a thickness of 5 nm to 20 nm.

8. The method of fabricating high-mobility dual channel material based on SOI substrate according to claim 1, wherein the implanted ion is one or more of H, He, N, Si and C.

9. The method of fabricating high-mobility dual channel material based on SOI substrate according to claim 1, wherein the ion implantation dose is 1E13-1E18/cm2 in step 5.

10. The method of fabricating high-mobility dual channel material based on SOI substrate according to claim 1, wherein an annealing temperature in the range of 300° C. to 1000° C. and a duration of 1 minute to 2 hours in step 5.

\* \* \* \* \*